US009575671B1

(12) United States Patent
Chinnakkonda Vidyapoornachary et al.

(10) Patent No.: US 9,575,671 B1
(45) Date of Patent: Feb. 21, 2017

(54) READ DISTRIBUTION IN A THREE-DIMENSIONAL STACKED MEMORY BASED ON THERMAL PROFILES

(71) Applicant: International Business Machines Corporation, Armonk, NY (US)

(72) Inventors: Diyanesh B. Chinnakkonda Vidyapoornachary, Bangalore (IN); Saravanan Sethuraman, Bangalore (IN); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 14/823,383

(22) Filed: Aug. 11, 2015

(51) Int. Cl.
*G06F 3/06* (2006.01)
*G11C 7/04* (2006.01)
(Continued)

(52) U.S. Cl.
CPC .......... *G06F 3/0616* (2013.01); *G06F 3/0604* (2013.01); *G06F 3/0629* (2013.01); *G06F 3/0653* (2013.01); *G06F 3/0683* (2013.01); *G11C 7/04* (2013.01); *G06F 9/3004* (2013.01); *G11C 11/4091* (2013.01); *G11C 11/40626* (2013.01)

(58) Field of Classification Search
CPC .... G06F 3/0616; G06F 3/0604; G06F 3/0653; G06F 3/0629; G06F 3/0683; G11C 11/40626; G11C 11/4091; G11C 7/04
USPC .......................................... 711/105, 106, 155
See application file for complete search history.

(56) References Cited

U.S. PATENT DOCUMENTS 6,122,704 A  9/2000  Hass et al.
7,916,574 B1  3/2011  Solomon et al.
(Continued)

FOREIGN PATENT DOCUMENTS

DE  10221206 A1  12/2003
JP  2004310163 A  11/2004

OTHER PUBLICATIONS

Hsieh et al., "Thermal-Aware Memory Mapping in 3D Designs," DATE '09: Design, Automations & Test in Europe Conference & Exhibition, Apr. 2009, pp. 1361-1366, © 2009 EDAA.
(Continued)

*Primary Examiner* — Than Nguyen
(74) *Attorney, Agent, or Firm* — Stosch Sabo

(57) ABSTRACT

A memory controller may receive a plurality of thermal profiles from a plurality of three-dimensional (3D)-stacked memory chips, where the plurality of thermal profiles include thermal profile data for the memory chips, where the thermal profile data includes a memory chip usage data and a location data for each of the memory chips, and where the memory chips include a first memory chip and a second memory chip. The memory controller may generate a first predicted memory chip usage data and location data by analyzing the usage data and location data of the thermal profile data. A second predicted memory chip usage data and location data may be generated. Based on the predicted memory chip, fractional memory chip read propensity data may be generated. The memory controller may distribute, according the first fractional memory chip read propensity distribution, memory chip read operations.

20 Claims, 7 Drawing Sheets

(51) Int. Cl.
      *G11C 11/4091*    (2006.01)
      *G11C 11/406*     (2006.01)
      *G06F 9/30*       (2006.01)

(56)             References Cited

U.S. PATENT DOCUMENTS

| | | | |
|---|---|---|---|
| 7,940,591 | B2 | 5/2011 | Mitchell, Jr. |
| 7,996,611 | B2 | 8/2011 | Nakagawa et al. |
| 8,516,426 | B2 | 8/2013 | Bose et al. |
| 8,566,539 | B2 | 10/2013 | Flemming et al. |
| 8,797,818 | B2 | 8/2014 | Jeddeloh |
| 8,869,007 | B2 | 10/2014 | Cordero et al. |
| 8,924,661 | B1 | 12/2014 | Shachar et al. |
| 8,954,654 | B2 | 2/2015 | Yu et al. |
| 8,990,531 | B2 | 3/2015 | Ahmad |
| 2007/0155102 | A1 | 7/2007 | Goldbach et al. |
| 2009/0168505 | A1 | 7/2009 | Hanzawa et al. |
| 2010/0169585 | A1* | 7/2010 | Steinbrecher et al. ....... 711/154 |
| 2010/0180089 | A1* | 7/2010 | Flemming et al. ........... 711/157 |
| 2011/0110141 | A1 | 5/2011 | Tran |
| 2011/0310662 | A1 | 12/2011 | Scheuerlein |
| 2013/0138901 | A1 | 5/2013 | Cordero et al. |
| 2013/0275665 | A1* | 10/2013 | Saraswat et al. ............. 711/106 |
| 2013/0301207 | A1 | 11/2013 | Chun et al. |
| 2014/0043883 | A1 | 2/2014 | Leedy |
| 2014/0241048 | A1 | 8/2014 | Farooq et al. |
| 2014/0268973 | A1 | 9/2014 | Connolly |
| 2015/0082062 | A1* | 3/2015 | Saraswat et al. ............. 713/323 |
| 2016/0054937 | A1* | 2/2016 | Tuers et al. .................. 711/103 |

OTHER PUBLICATIONS

Lee et al., "Runtime 3-D Stacked Cache Data Management for Energy Minimization of 3-D Chip-Multiprocessors," 2014 15th International Symposium on Quality Electronic Design (ISQED), Mar. 2014, pp. 197-204, © 2014 IEEE.

Chinnakkonda Vidyapoornachary et al., "Mirroring in Three-Dimensional Stacked Memory," U.S. Appl. No. 14/538,966, filed Nov. 12, 2014.

Chinnakkonda Vidyapoornachary et al., "Mirroring in Three-Dimensional Stacked Memory," U.S. Appl. No. 14/556,735, filed Dec. 1, 2014.

Bernstein et al., "Interconnects in the Third Dimension: Design Challenges for 3D ICs," DAC '07: Proceedings of the 44th Annual Design Automation Conference, Jun. 2007, pp. 562-567, ACM New York, NY © 2007. DOI: 10.1145/1278480.1278623.

Kim et al., "Thermal Characterization of Interlayer Microfluidic Cooling of Three-Dimensional Integrated Circuits with Nonuniform Heat Flux," Journal of Heat Transfer, Apr. 2010, vol. 132, Copyright © 2010 ASME.

* cited by examiner

READ DISTRIBUTION IN A THREE-DIMENSIONAL STACKED MEMORY BASED ON THERMAL PROFILES

BACKGROUND

The present disclosure relates to memory in computers, and more specifically, to mirroring in three-dimensional stacked memory.

As memory used in computers increases in speed and capacity, it tends to create more heat. For this and other reasons, individual memory units may fail. Traditionally, memory chips, such as those of random access memory (RAM), have been laid out in a two-dimensional scheme. As memory increases in speed and capacity, three-dimensional (3D)-stacked memory schemes are becoming more common. 3D-stacked memory is subject to various challenges, including thermal distribution of memory chips within a 3D-stacked memory structure.

SUMMARY

Embodiments of the present disclosure provide for a method, system, and computer program product for mirroring in three-dimensional stacked memory. The method, system, and computer program product can include receiving, by a memory controller, a plurality of thermal profiles from a plurality of three-dimensional (3D)-stacked memory chips, where the plurality of thermal profiles include thermal profile data for the memory chips, where the thermal profile data includes a memory chip usage data and a location data for each of the memory chips, and where the memory chips include a first memory chip and a second memory chip. The memory controller may generate a first predicted memory chip usage data and location data of the first memory chip by analyzing the usage data and location data of the thermal profile data of the first memory chip. The memory controller may generate a second predicted memory chip usage data and location data of the second memory chip by analyzing the usage data and location data of the thermal profile data of the second memory chip. The memory controller may determine, based on the first predicted memory chip usage and the second predicted memory chip usage, fractional memory chip read propensity data for the first memory chip and the second memory chip. The fractional memory chip read propensity data includes memory chip read distribution data. The memory controller may determine a first fractional memory chip read propensity distribution, based on the fractional memory chip read propensity data. The memory controller may distribute, according the first fractional memory chip read propensity distribution, memory chip read operations to the first memory chip and the second memory chip.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
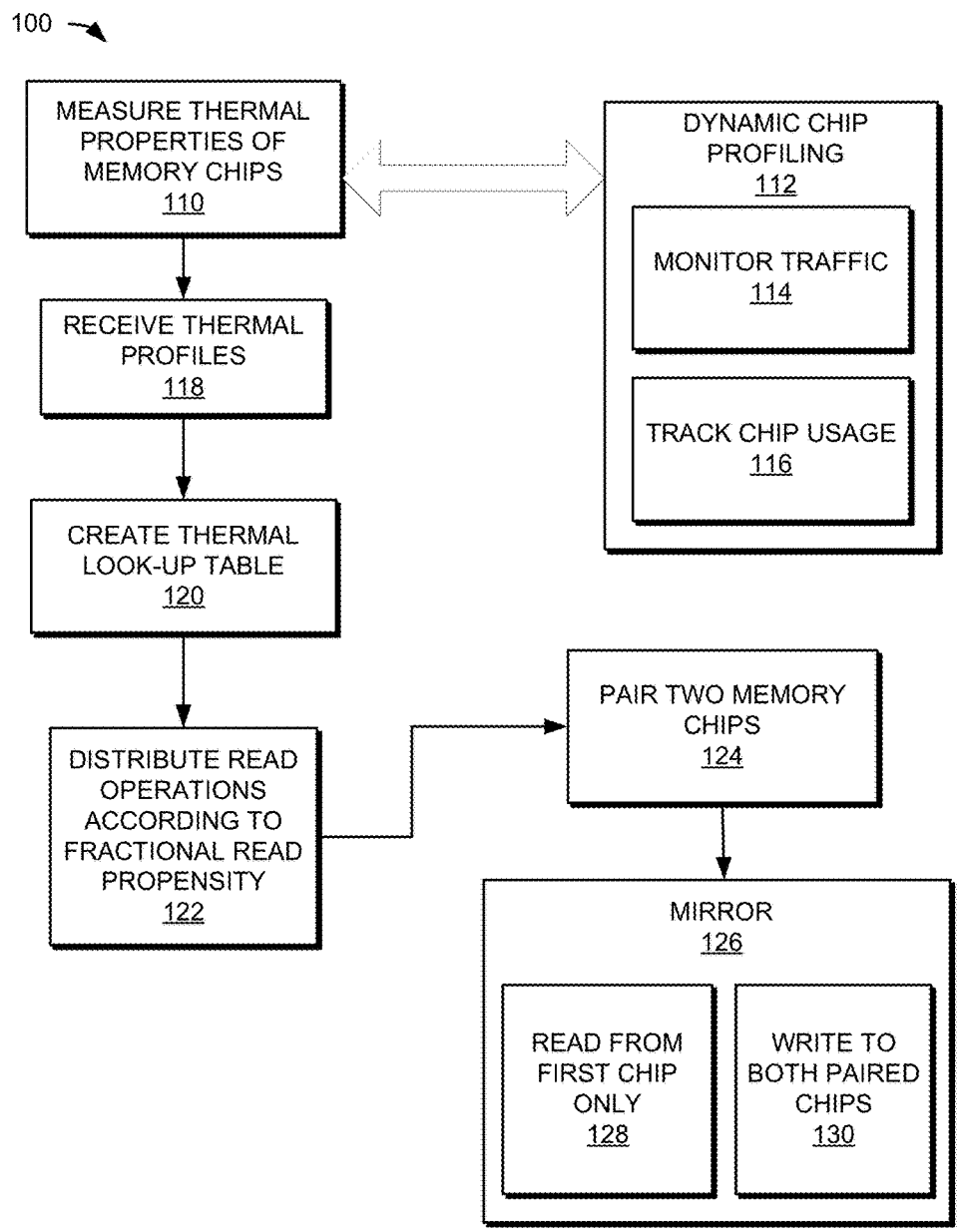
FIG. 1 depicts a flowchart of a method for mirroring 3D-stacked memory, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to mirroring in three-dimensional (3D)-stacked memory, more particular aspects relate to improving memory performance using thermal profiles to efficiently mirror 3D-stacked memory.

3D-stacked memory subsystems employing mirroring functions may aim to optimize the location of mirroring chips in the stack to improve thermal and overall performance, as described herein. Improvements in performance in 3D-stacked memory mirroring may be achieved through profiling memory chips within a 3D-stacked memory structure. Based on sensed past, present, or predicted future workload or usage data, the distribution of reads of memory chips in a 3D-stacked memory structure may be changed dynamically in order to optimize performance. As described herein, read operation may not be restricted to go to cooler memory chips in a stack, but may instead utilize a certain fraction of reads from a hotter area in a memory structure.

While the present disclosure is not necessarily limited to such applications, various aspects of the disclosure may be appreciated through a discussion of various examples using this context.

Next-generation server systems demand hardware with high-speed and large memory capacity in order to cater to constantly growing customer demands. Various separate elements may limit server systems' performance. In terms of memory, existing two-dimensional memory layouts are nearing the practical limit within the planar layout.

3D-stacked memory packaging enables stacking of multiple memory chips connected through through-silicon vias ("TSVs"), which offers both very high memory density and a reduced memory form factor. Additionally, 3D-stacked memory architecture may allow higher density integration than currently exists, and it therefore is likely play an important part in future memory subsystems.

However, 3D-stacked memory also presents various challenges, including challenges related to thermal distribution and individual chip distribution. Utilizing methods and systems by which a thermal distribution within 3D-stacked memory may be measured, memory chips (i.e., memory dies) may be organized and utilized in various ways. The memory chips may be organized and utilized such that heat is more efficiently controlled and each chip's usage is optimized based on a thermal profile of the chip and the thermal profiles of other memory chips.

Various challenges may be presented by 3D-stacked memory architecture in aspects pertaining to, for example, the areas of power and thermal. Generally, 3D-stacked memory layouts may include an elevated or increased power per unit area (as compared to a conventional planar layout) as created heat must be transmitted through multiple chips. The multiple, stacked chips may tend to have suboptimal thermal properties, including poor thermal distribution, especially at various physical interfaces. Heat may also be concentrated in some areas of the 3D-stacked memory, while other areas may be relatively colder.

For example, in a four-chip stacked memory, each chip's thermal status within the stack is varied mainly because of each memory chip's position in the stack. Typically, the top and bottom chips in the stack connect to package/pins/circuit board and thus have a different and usually better thermal profile compared to two chips located in the middle of the stack, according to this example. An alternative approach of ensuring identical thermal profile across all chips in the stack would require each chip design to be different and this would make chip fabrication complicated, expensive, time-consuming and overall less desirable.

There is also currently a desire to incorporate traditional row-address-strobe ("RAS") functions to ensure availability of reliable data. Mirroring is one such function, in which the memory stores two copies of the same data. Memory mirroring functions separate memory into two separate channels, generally on a memory device. Memory mirroring serves the purpose of creating redundancy in a memory device, where one channel is copied to another channel.

With memory mirroring, one data source, such as a byte, may be accessed from two separate locations, allowing for improvements in reliability and confirmation that no data has been lost due to memory failures. Stated differently, in addition to the write operations, read operations of the mirroring functions, may read from only one source. The one source may be either a main memory chip or backup copy memory chip. As such, memory mirroring generally provides protection against single and multiple bit errors. Memory mirroring generally involves performing write operations on both a main memory chip and a backup memory chip.

When level mirroring is enabled across one or more chips within the 3D-stacked memory package to enable RAS for mitigation of chip level fails, then chips that are mirroring would be utilized by only write operations.

In dynamic random access memory ("DRAM"), refresh/read/write operations are the primary contributors to the varying (dynamic) power consumption and therefore also the temperature of the chip. Memory refresh is a fundamental operation required for data retention in volatile DRAM. However, read and write operations (also known simply as "reads" and "writes," respectively) may be based on memory workload, including memory traffic and usage.

If chips having hotter thermal profiles (generally chips in the middle of the stack) are chosen for storing the main copy (mirrored) in 3D-stacked memory, then this approach would fail to optimize the overall temperature profile, leading to higher temperatures of various chips because of occurrences of read and write operations. These higher temperatures not only increases the need for more system level cooling, but also has other derivative effects, such as increased chip leakage power and limited temperature margins for throttling.

Considering the drawbacks and limitations in existing 3D-stacked memory, a novel method and approach is desired to choose the chip locations in the stack for mirroring function to optimize memory package thermal and system cooling performance.

In embodiments, a thermal look-up table ("TLT") may be a database that contains data including a list of unique memory chips and each memory chip's associated thermal profile, location, and any maximum temperature limits placed on the chips. The database may be sorted or arranged in various arrangements.

In embodiments, a mirror tag field may be a set of relational data that includes the relational status of various mirrored memory chips. The mirror tag field may be stored or located within the TLT, the memory controller, or the RAM, according to various embodiments.

In embodiments, vital product data ("VPD") may include a collection of informational data associated with a particular set of hardware or software that is stored on a hard disk or other device. The VPD may allow a device to be administered at a system or network level. Information includes in a VPD may include, but is not limited to, product model numbers, unique serial numbers, product release levels, maintenance levels, or any other information specific to a device type. VPD may include user-defined information, according to various embodiments. Collection or use of VPD may allow the status of a network or computer system to communicate and provide service more quickly. VPD may be burned onto electronically erasable read only memory ("EEPROM") associated with various hardware components, or may be queries through integer-integrated circuit ("I2C") buses or devices.

In embodiments, a memory controller is a digital circuit, which manages the flow of data going to and from the computer's main memory. It can be a separate chip or integrated into another chip, such as on the die of a microprocessor.

In embodiments, for a given cooling capacity (e.g., airflow or heat dissipation), each memory chip in the stack will have a thermal profile depending on its location in the stack. The static thermal profile may be generated before analyzing the temperature distribution, according to various embodiments. A particular static thermal profile may not update once it is created and is referred to herein as a static thermal profile. An example static thermal profile may be a fixed list of each memory chip and the thermal profile associated with each memory chip.

In embodiments, during memory runtime conditions, based on traffic and usage (e.g., how long), the thermal profile of each memory chip will vary. The time-varying thermal profile is the dynamic thermal profile. For example, a dynamic thermal profile management scheme may set a maximum temperature for any chips, or may redistribute usage of chips to maintain a roughly equal temperature across all chips.

This disclosure can be employed in various 3D-based technologies, including, but not limited to, 3D storage ("3DS"), 3D-stacked memory, advanced memory cubes, and hybrid memory cubes.

FIG. 1 depicts a flowchart of a method 100 for mirroring 3D-stacked memory, according to various embodiments.

A memory controller measures thermal properties of memory chips 110. The memory controller may utilize a memory buffer, according to various embodiments. The thermal properties of the memory chips may be measured by various sensors, including thermometers or infrared sensors. The thermal properties of each memory chip may be measured individually, so that there are measured thermal properties for each individual memory chip.

Measuring the thermal properties of the memory chips only once, which is known as static chip profiling, may be suboptimal, according to various embodiments. If there is a desire to continuously optimize the 3D-stacked memory, the memory controller may utilize dynamic chip profiling operation 112. Dynamic chip profiling may continuously, or repeatedly, update various chips' thermal properties over time as the memory chips are utilized, according to various embodiments.

The dynamic profile may be represented by the following formula:

$$DP=SP+RC,$$

where DP denotes dynamic profile, SP denotes static profile, and RC denotes runtime conditions.

In this way, a static thermal profile may act as a reference frame, and the dynamic thermal profile may utilize one or more static thermal profiles in its continuous or repeated updates, for example, by re-measuring the thermal properties of the memory chips, wherein the thermal properties, such as temperature, of memory chips may be measured more than one separate time, according to various embodiments.

The memory controller, during dynamic chip profiling at operation 112, may monitor the traffic of the memory chips at operation 114. Traffic to and from the memory chips, via the memory buffer may include the number of signals that are communicated, and from which memory chips the signals were generated, according to various embodiments. For instance, the memory controller may monitor the traffic of the memory chips and may find that one particular chip is being used or accessed five times as often (irrespective of how much actual work the chip is performing) as another chip. The gathered data, for various chips, may then be used in the dynamic chip profiling process. Based on the dynamic chip profiling 112, predictions may also be made in terms of future usage of the memory chips. According to various embodiments, predicted memory chip usage data and location data may be generated by analyzing usage data and location data of thermal profile data of a memory chip. Thermal profile data may include past and present thermal profile data, according to various embodiments.

The memory controller may track the usage of the memory chips at operation 116, according to various embodiments. Memory chip usage may include how much a particular memory chip is utilized. This utilization may include the duration and type of work that is done on that particular memory chip. For example, some storage actions in a memory chip may be intensive and create relatively more heat than other tasks, and some tasks may be long in duration but not as intensive or as prone to creation of heat or the drawing of power.

Together, the dynamic chip profiling at operation 112, using traffic monitoring at operation 114 and tracking chip usage at operation 116 may create an up-to-date composite profile of a chip, or many chips, according to various embodiments.

The memory controller may receive a plurality of thermal profiles corresponding to a plurality of memory chips at operation 118. The received plurality of thermal profiles may include static thermal profiles, dynamic thermal profiles, thermal profile data, or variations thereof, according to various embodiments. According to various embodiments, the thermal profile data may include memory chip usage data and location data for each of the memory chips, and the memory chips may include a first memory chip and a second memory chip, according to various embodiments. The memory chip usage data of a memory chip may include dynamic chip profiling. Dynamic chip profiling, according to various embodiments, may include reading more frequently temperature data as compared to a static method. An example static method may include reading temperature profile data from a pre-characterized or stored location.

The memory controller may then create a thermal look-up table ("TLT") at operation 120 from the thermal profiles received at operation 118. In order to optimize memory performance, a memory controller may maintain the TLT, including the following attributes for each 3D-stacked memory structure: chip location, maximum temperature bounds of each chip, and a mirror tag field, as described herein. These attributes may be considered vital product data (VPD), according to various embodiments.

During system boot, the TLT, to support activation of the mirroring process, may receive memory chips' thermal profiles and the TLT may be created in this fashion. The TLT may store received profiles from the plurality of memory chips. The TLT may contain VPD, according to various embodiments. The thermal profile of each memory chip can be contained or stored in a thermal look-up table (TLT) in VPD, according to various embodiments.

The memory controller may then read the devices to finds the temperatures or temperature differences between the memory chips. An example 3D-stacked memory may contain, for instance, N unique memory chips.

The memory controller may then configure read operations according to a fractional read propensity at operation 122. The memory controller may access the TLT with information related to the N memory chips and may formulate an optimal ordering of read operations to be performed on the memory chips. In DRAM, hottest and coldest memory chips may have proportional heat levels to the amount of usage, or the frequency that data is accessed on each memory chip. For example, a memory chip that frequently is being accessed may be hotter than a memory chip that is rarely being access. Likewise, a coldest memory chip may have the least usage and a hottest memory chip may have the most usage, according to various embodiments. However, cooling and positioning in a stack may also be factors leading to various heat levels. The memory controller may accordingly evaluate a plurality of previous thermal profiles, and re-rank the memory chips from a coldest temperature to a hottest temperature in a TLT. As used herein, cold, colder, and coldest refer to states of low thermal energy or temperature. As used herein, hot, hotter, and hottest refer to states of high thermal energy or temperature.

A fractional read propensity may be determined for a memory chip in various ways. The determination of the fractional (memory chip) read propensity, and fractional read propensity data may be based on predicted memory chip usage data and location data of one or more memory chips, according to various embodiments. The predicted memory chip usage data and location data of a memory chip may include a predicted read burst, according to various embodiments. The predicted read burst may guide the distribution of reads of one or more memory chips accordingly. According to various embodiments, a memory controller may distribute memory chip write operations to one or more memory chips according to fractional memory chip read propensity. Memory chip read distribution may include read burst interleaving. Memory chip write distribution may include write burst interleaving. For example, burst interleaving, in the 3D memory structure having four stacks, may include one or more scheduling algorithms configured to switch reads and writes and interleave the reads and writes so that the same chip is not overly used and/or accessed, especially in cases of intense usage over periods of time.

The fractional memory chip read propensity data of a memory chip may include memory chip read distribution data. A fractional memory chip read propensity distribution may be determined based on fractional memory chip read propensity data, according to various embodiments. A memory controller may then distribute memory chip read operations to one or more memory chips according to the fractional memory chip read propensity distribution. A fractional read propensity distribution may be determined by determining that a change in a thermal profile of one or more memory chips meets a first threshold. In response to the threshold being met, the switching of reads and writes may be reduced may changing chip usage accordingly. Fractional memory chip read propensity distribution may be optimized for performance, according to various embodiments.

Various approaches ensure that memory chips in the stack that have a hotter thermal profile, either theoretical or actual, will generally have only write operations, leading to lesser power consumption and a corresponding lower temperature for the hotter memory chips. However, as described herein, a memory chip having a hotter profile may not always only have write operations, and the hotter memory chip may also have read operations performed on it. Likewise, a memory chip having a colder profile may variously have only write operations or both write and read operations performed on it. Longer-term trends may allow improved memory performance compared to strictly following a scheme where a colder memory chip will generally be assigned more work than a respective hotter memory chip.

The memory controller may then pair two memory chips for mirroring at operation 124. The memory controller may pair two memory chips based on a fractional read distribution. As described herein, the two paired memory chips may include one hotter memory chip and one colder memory chip. However, the two paired memory chips may alternatively include two relatively hot or relatively cold memory chips. Thermal profiles, including location, usage, temperature, etc. may play a role in the pairing of two memory chips for mirroring, but paired memory chips need not include one hot memory chip and one cold. The decision of choosing the chip for pairing can be based on the static thermal profile at the start and the dynamic thermal profile during runtime memory usage. The memory chips may be assigned and paired as follows for mirroring, according to one embodiment.

The memory controller may then mirror the pairing of memory chips at operation 126 as paired at operation 124. Mirroring the two paired memory chips of each pair of memory chips includes reading and writing to the paired chips according to a predetermined scheme, for instance every other within a stack, or matching inner chips with outer chips, etc. In various embodiments, a single memory chip of a pair may be read by the memory controller, whereas both memory chips of a pair may be written to.

The memory controller then may then allocate mirroring capable memory chips in the stack. The allocation may utilize the hottest memory chip to be mirrored first, but may also use other methods to determine in what order to mirror various memory chips. According to one approach, a memory controller, through a memory buffer, may conduct fewer writes compared to reads and thereby reduces intensity of usage of middle memory chips in the stack to improve thermal profile. According to another approach, the memory controller may instead reduce the intensity of memory chips in a region other than the middle, such as the top or the bottom of the memory chip stack.

The memory controller reads from a first memory chip only of the two paired memory chips at operation 128. The memory controller may read the data content of the first memory chip of the paired memory chips, while not reading the other memory chip of the paired memory chips. The first memory chip may be the hotter of the two paired memory chips, according to various embodiments. As described herein, asymmetrically reading and writing of the two paired memory chips, may allow for more methodical and efficient allocation of memory chip usage and a better thermal equilibrium and distribution of the memory structure and 3D-stacked memory overall.

The memory controller also writes to both paired memory chips at operation 130. Both paired memory chips are written because either of the paired memory chips may be read during a read operation, depending on the circumstance. The two paired memory chips are written with identical data to each other. The first memory chip of the pairing of memory chips may therefore be written to and read from, in contrast to the second memory chip, which may be only written, not read.

Figure 2:
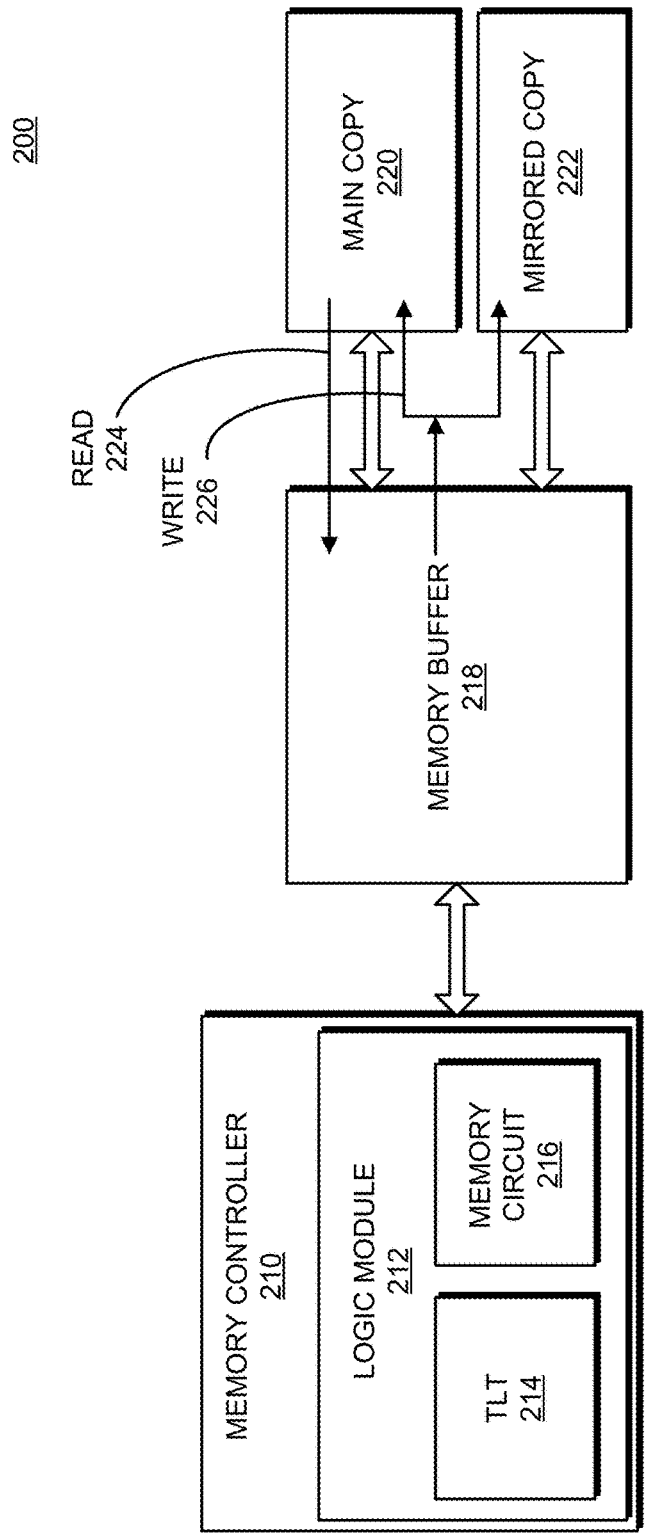
FIG. 2 depicts a representation of a mirroring scheme, according to various embodiments.

FIG. 2 depicts a block diagram of a method 200 for mirroring 3D-stacked memory, according to various embodiments.

The memory controller 210 may include a logic module 212, a TLT 214, and one or more memory circuits 216, according to various embodiments. The memory controller 210 may communicate with the memory chips, including main copy 220 and mirrored copy 222, by way of a memory buffer 218, according to various embodiments. The memory buffer 218 may perform read 224 and/or write 226 operations.

The logic module 212 main be a central processing unit ("CPU") or other processing unit configured to function with computer memory and other computer components, according various embodiments. See description of element 613 in FIG. 6 for additional embodiments and details of logic module 212, as described herein.

The thermal look-up table ("TLT") 214, may be similar to the TLT as described in operation 120 of FIG. 1. The memory controller 210 main may contain the TLT 214. Each memory chip's thermal profile may be vital product data ("VPD") stored within the TLT 214, and the thermal profile may be defined in a relative number between the chips or in absolute terms, according to various embodiments. For example, the TLT 214 may store and define thermal profiles in terms the other thermal profiles. For example, memory chip 1 may be identified as being currently hotter than memory chip 2, with the chips defined relative to each other and other memory chips in the memory structure. However, according to another embodiment, memory chip 3 may have a thermal profile of 70° C. and memory chip 4 may have a thermal profile of 75° C., and the thermal profiles may be stored in the TLT 214 in absolute terms.

The TLT 214 may be updated based on a unique memory chip identifier (e.g., a custom card identification number ["CCIN"]) and the DRAM location of each dual in-line memory module ("DIMM") in case of 3D-stacked DRAMs in a DIMM. According to various embodiments, the one or more memory circuits 216 may be circuits configured to control memory, and may interface to the logic module 212 and memory buffer 218.

Block diagram 200 may include a memory buffer 218, which may take a variety of forms, according to various embodiments. The memory buffer 218 may be electrically coupled to the memory controller 210 and the main copy 220 and mirrored copy 222 memory chips. For example, to determine which memory chip in a stack is to be mirrored, temperature sensors in each memory chip may be connected together using, e.g., integer-integrated circuit ("I2C") devices. I2C devices and protocols may be examples of memory buffers, or other forms of communication interfaces, according to various embodiments.

The main copy 220 is the memory chip in the pairing of memory chips that has both read and write operations performed on or from it. The main copy 220 may be similar to the second paired memory chip, according to various embodiments. The main copy 220 may accordingly be the colder of the two paired memory chips. The mirrored copy 222 is the memory chip in the pairing of memory chips that has write operations performed on it. The mirrored copy 222 may be similar to the first paired memory chip, according to various embodiments. The mirrored copy 222 may accordingly be the hotter of the two paired memory chips.

The memory read function 224, as described herein, may involve the information on a memory chip being accessed, stored, or transferred from the memory chip. The read function may be performed by the memory buffer 218, according to various embodiments. The memory write function 226, as described herein, may involve information being written on a memory chip for later access. The read function may be performed by the memory buffer 218, according to various embodiments. Memory write functions 226 ("writes") go to both the copies. This can be done in a static way and the logic module 212 can decode the same. The 3D-stacked memory's memory controller 210 may include the logic module 212, as discussed herein. The logic module 212 may control functions of the memory chips within the 3D-stacked memory. During system boot, or initial program load ("IPL"), the logic module 212 may direct which memory chips, main copy 220 or mirrored copy 222, will be used for mirroring based on the TLT 214. This mirroring may use a static thermal profile described herein, and the logic module 212 may also use dynamic thermal profiles, according to various embodiments.

Figure 3:
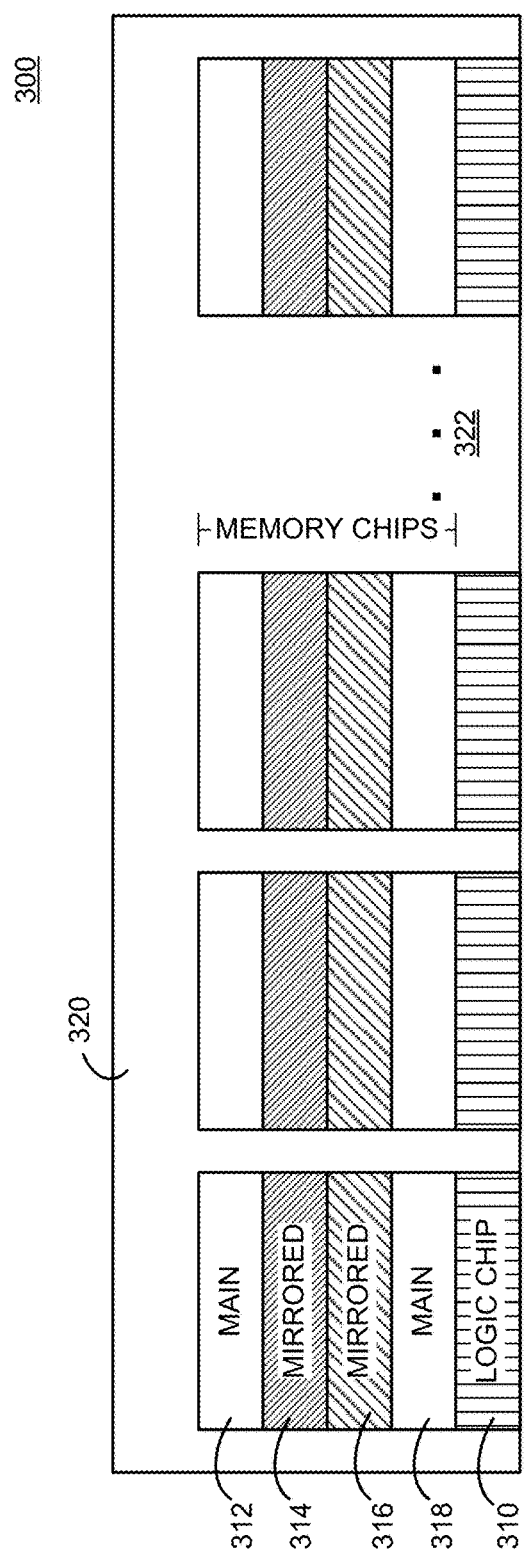
FIG. 3 depicts a side view of a 3D-stacked memory, according to various embodiments.

FIG. 3 depicts a side view of a 3D-stacked memory 300, according to various embodiments. Various memory chips are shown in a stack, including four memory chips and one logic chip in this embodiment. The logic chip may be a processor, memory controller or other chip, according to various embodiments.

The memory chips may be stacked vertically in at least one 3D-stacked memory chip stack. A logic chip 310 may be located at the base of the 3D-stacked memory. A top memory chip 312 may be a main memory chip, and may be located at the top of the 3D-stacked memory 300. A first middle memory chip 314 may be a mirrored memory chip, and may be located below the top memory chip 312. A second middle memory chip 316 may be a mirrored memory chip, and may be located above a bottom memory chip 318.

The bottom memory chip 318 may be located above the logic chip 310, and may be located below the second middle memory chip 316. A gap fill, dielectric region 320 may surround any exposed faces of any memory chips or the logic chip, according to various embodiments. The gap fill may be any suitable dielectric material or materials, including silicon nitride (SiN), among others. According to various embodiments, there may be any number of 3D-stacked memory stacks, including memory chips and a logic chip per stack. There may be multiple stacks of memory chips, as denoted by 322.

Figure 4:
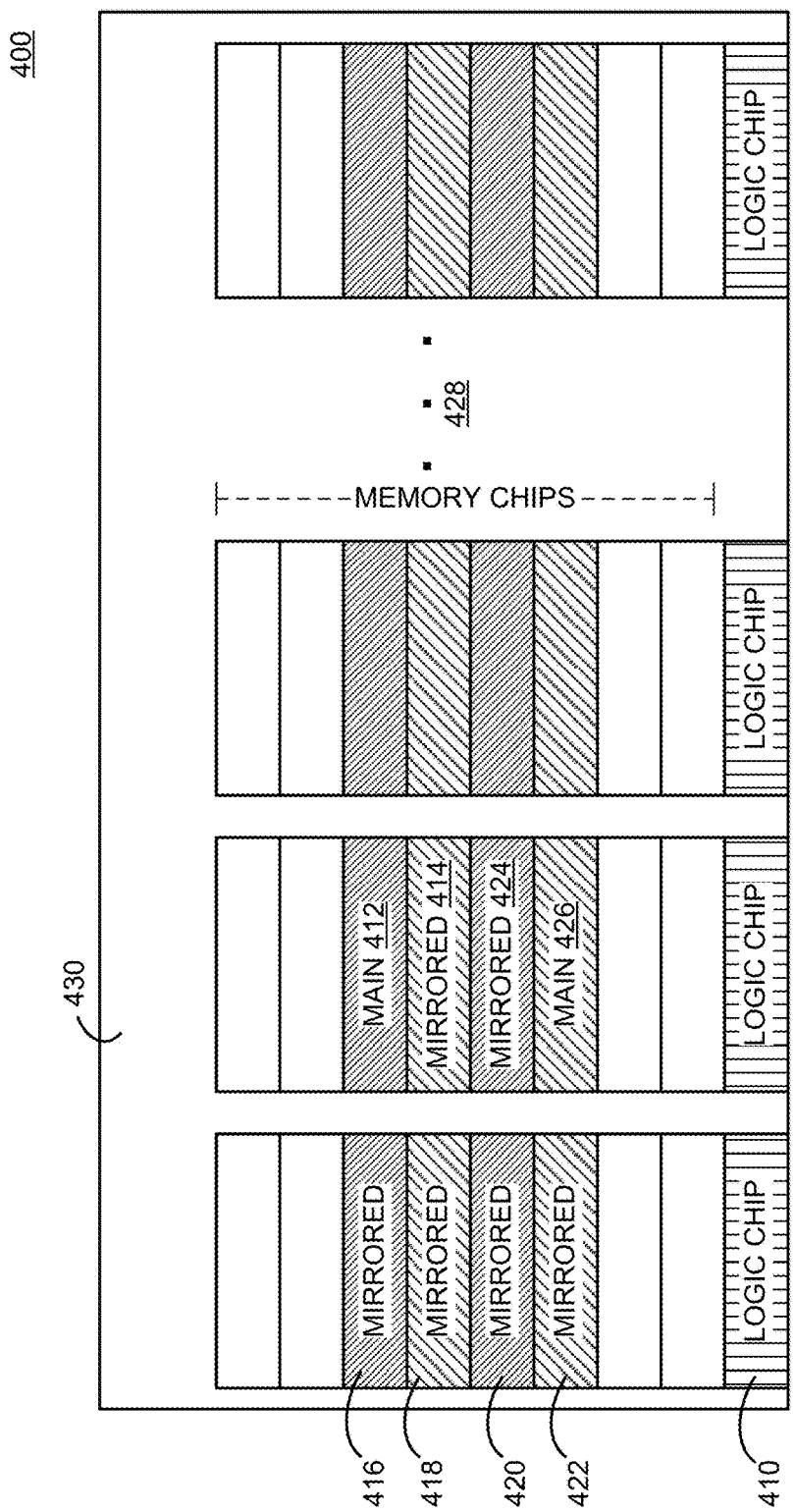
FIG. 4 depicts a side view of a 3D-stacked memory, according to various embodiments.

FIG. 4 depicts a side view of a 3D-stacked memory 400, according to various embodiments. Various memory chips are shown in a stack, including eight memory chips and one logic chip in this embodiment. The logic chip may be a processor, memory controller or other chip, according to various embodiments.

The memory chips may be stacked vertically in at least one 3D-stacked memory chip stack. A logic chip 410 may be located at the base of the 3D-stacked memory. Memory chips 416, 418, 420, and 422 may be mirrored memory chips, and may be located at the center of the 3D-stacked memory 400, which may be an optimal location for mirrored memory chips to be located. In another memory chip stack, memory chips 412 and 426 may be main memory chips (read and write) and memory chips 414 and 424 may be mirrored memory chips (write only). Although the memory chip stacks appear similar, a read and write distribution may be utilized where memory chip reads and writes are distributed in various ways. Read and write distribution may be randomized either at various times or continuously, according to various embodiments.

A gap fill, dielectric region 430 may surround any exposed faces of any memory chips or the logic chip, according to various embodiments. The gap fill may be any suitable dielectric material or materials, including silicon nitride (SiN), among others. According to various embodiments, there may be any number of 3D-stacked memory stacks, including memory chips and a logic chip per stack.

Figure 5:
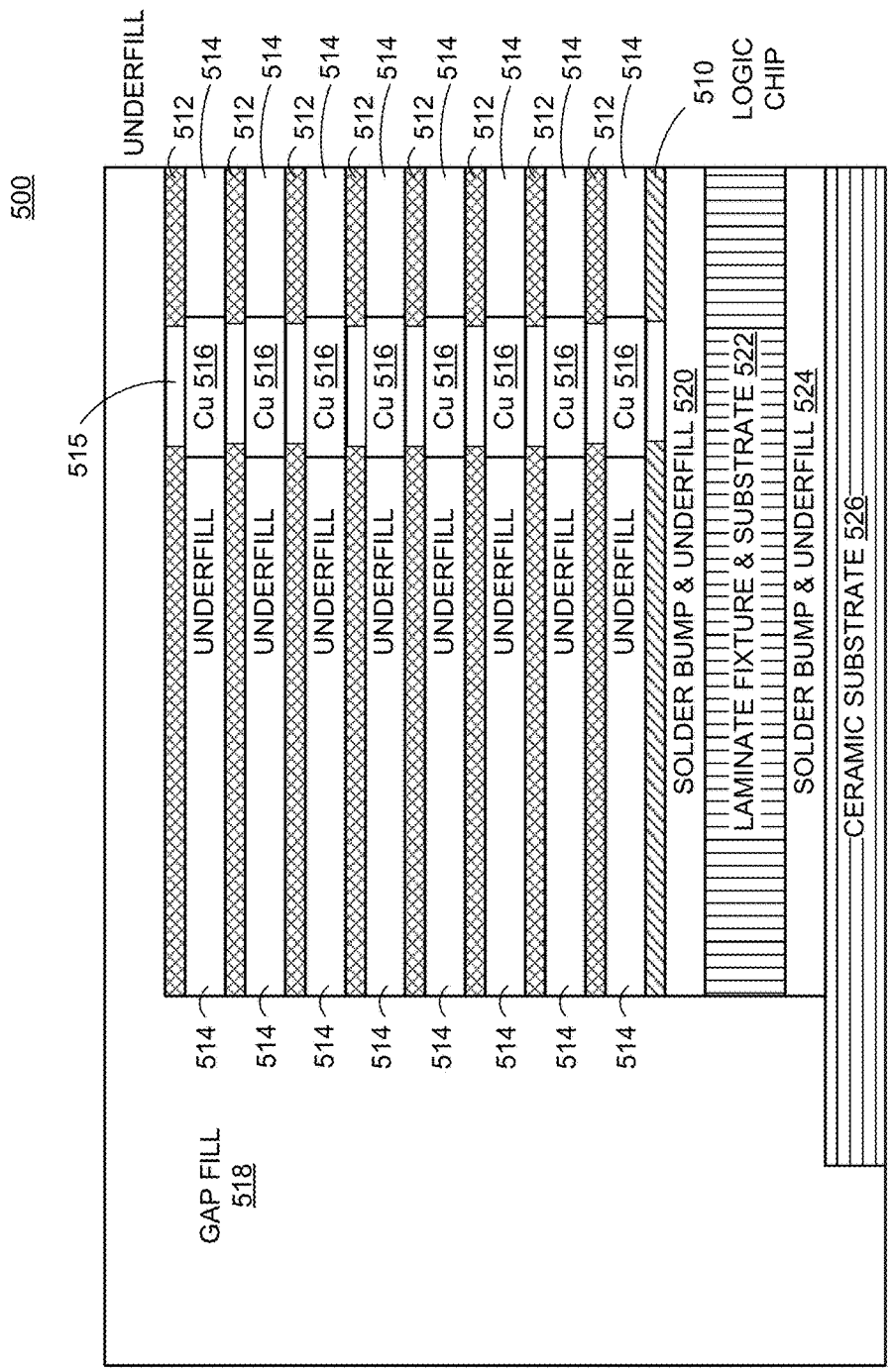
FIG. 5 depicts a side view of a 3D-stacked memory, according to various embodiments.

FIG. 5 depicts a side view of a 3D-stacked memory 500, according to various embodiments.

The memory chips may be stacked vertically in at least one 3D-stacked memory chip stack. This FIG. may show a 3D-stacked memory structure similar to those shown in FIG. 3 or 4, but in greater detail. A logic chip 510 may be located at the base of the 3D-stacked memory chips 512, and may be located between a solder bump and underfill 520 below, an underfill and copper (Cu) conduit 516 above, and a through-silicon-via 515 within the memory chips 512.

Memory chips 512 are shown, stacked with underfill 514 and vias 516 in between, and gap fill 518 on the end and top of the stack. In this depiction, eight memory chips 512 are represented, along with one logic chip 510 at the base of the memory chips. However, more or fewer memory chips 512 may be employed, according to various embodiments. Underfill regions 514 for be located between the memory chips 512, and may surround the vias 516. The underfill regions 514 may contact the gap fill region 518, according to various embodiments.

Copper connections 516 and through-silicon-via ("TSV") regions 515 may couple the memory chips 512 to one another, and may couple the lowest memory chip 512 with the logic chip 510. The TSV regions may be surrounded by underfill regions 514, according to various embodiments. A gap fill region 518 may fill remaining space adjacent and surround the 3D-stacked memory and substrate. The gap fill region 518 may be a dielectric material, including silicon nitride (SiN), among others. A first solder bump and underfill region 520 may lie below the logic chip 510, in a vertical arrangement. A laminate fixture and substrate 522 may lie below the solder bump and underfill region 520. A second solder bump and underfill region 524 may be located below the laminate fixture and substrate 522. A ceramic substrate 526 may lie at the base of the 3D-stacked memory structure, and may be wider than the solder bump and underfill layer 524, above.

Figure 6:
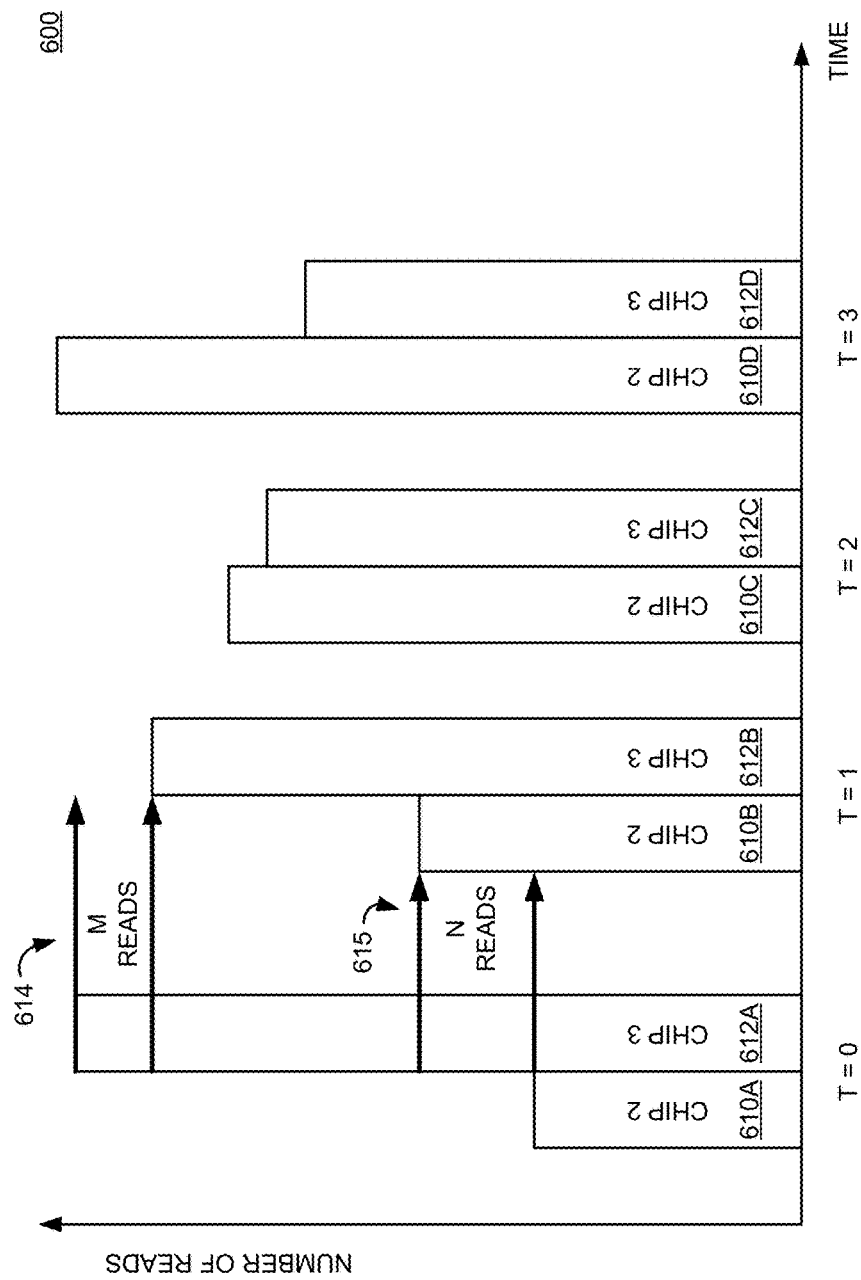
FIG. 6 depicts a graph of reads of two memory chips compared over time, according to various embodiments.

FIG. 6 depicts a graph 600 of reads of two memory chips compared over time, according to various embodiments.

Two memory chips represented are chip 2 and chip 3, shown at various times in a computing operation. The number of reads for chip 2 begins at time T=0 as 610A, then T=1 becomes 610B, T=2 becomes 610C, and for T=3 becomes 610D. Similarly, for chip 3, the number of reads shown at T=0 is 612A, T=1 is 612B, T=2 is 612C, and T=3 is 612D. The relative number of reads from successive times varies, as shown in graph 600. Chip 2, at 610B has fewer more than chip 2 at 610A, after a time has passed (from T=0 to T=1). The difference in the number of reads on chip 2 from 610A to 610B may be N reads 615. Similarly, the difference in the number of reads on chip 3 from 612A to 612B may be M reads 614.

Over time, the relative values of M reads and N reads may form a read ratio for memory chips 2 and 3. The read ratio may have a target, where the read ratio is above or below a certain threshold. Performance may be optimized by having a certain read ratio between two memory chips, according to various embodiments. According to various embodiments, distributing reads between M reads and N reads may switch when the chips read by M and N switch from hotter to cooler, respectively. According to other embodiments, a distribution of reads may follow other patterns.

Figure 7:
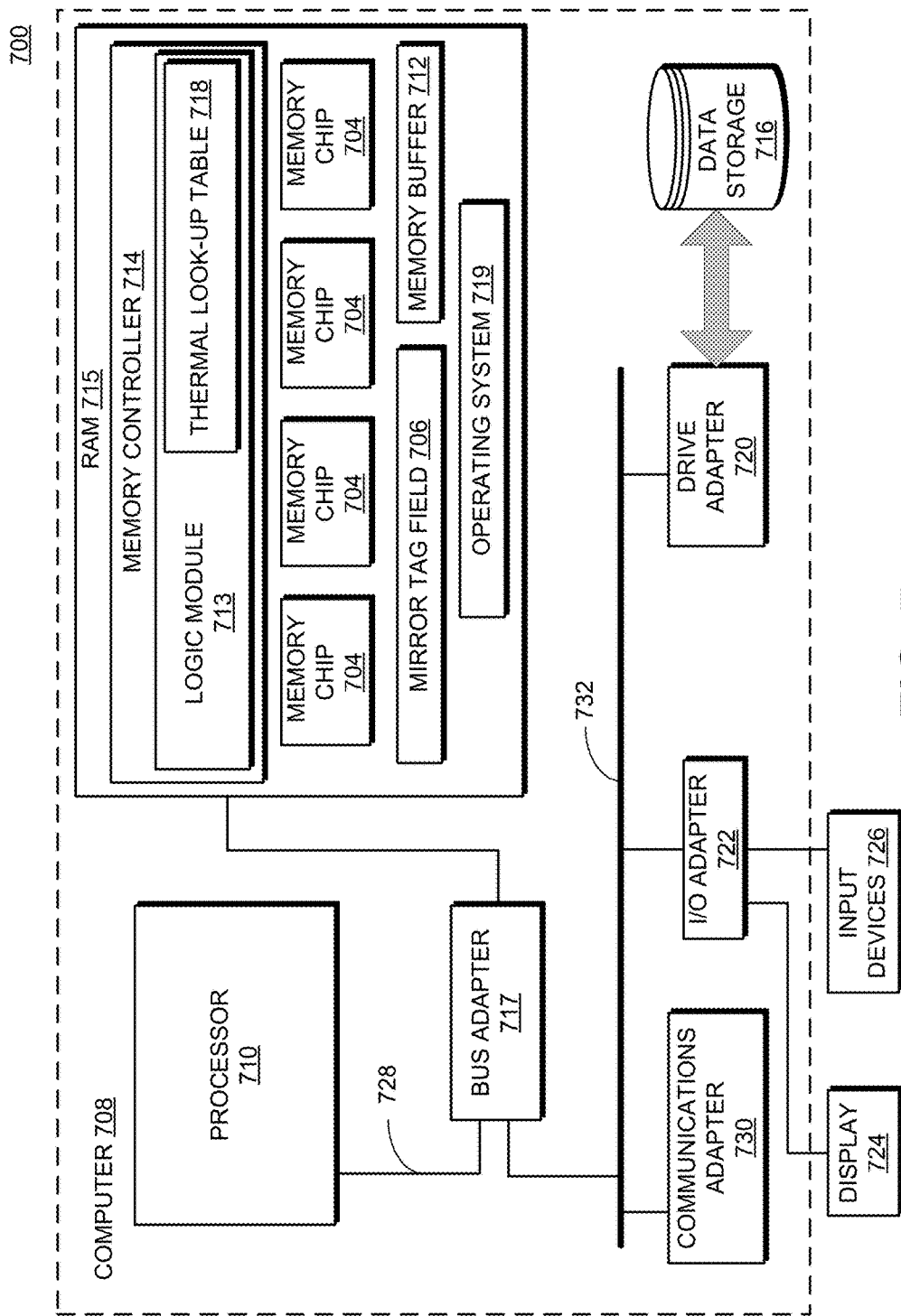
FIG. 7 depicts a 3D-stacked memory system, according to various embodiments.

FIG. 7 illustrates a block diagram of automated computing machinery 700, according to various embodiments. The computing machinery may include example computer 708 useful in performing aspects of the disclosure, according to various embodiments. The computer 708 includes at least one computer processor 710 or central processing unit ("CPU") as well as random access memory 715 (RAM) which is connected through bus adapter 717 to processor 710 and to other components of the computer 708. The computing machinery 700 or the processor 710 may include one or more computer processing circuits.

The RAM 715 may include a memory controller 714. The memory controller may controller various functions of the computer's 708 RAM 715, according to various embodiments. The memory controller's instructions may be stored to or read from data storage 716, which may be a hard disk drive, according to various embodiments. The memory controller's communications may be received from various modules located in the memory controller 714.

The RAM 715 may include a memory buffer 712. The memory buffer 712 may serve as a buffer for communication between the memory controller 714 or a memory logic chip 713 and the one or more memory chips 704. The memory controller's 714 instructions may be populated into the data storage 716. The memory controller 714 may access a mirror tag field 706, and may contain a thermal look-up table 718, according to various embodiments. The mirror tag field 706 and the thermal look-up table 718 may be stored in data storage 716, according to various embodiments.

The RAM 715 may include an operating system 719. Various operating systems may be useful for performing or executing various embodiments, as described herein. The operating system 719 is shown in RAM 715, but many components of such software typically are stored in non-volatile memory also, such as, for example, on data storage 716.

The computer 708 may also include disk drive adapter 720 coupled through expansion bus 732 and bus adapter 717 to processor 710 and other components of the computer 708. Drive adapter 720 connects non-volatile data storage to the computer 708 in the form of disk drive 716. Disk drive adapters useful in computers include Integrated Drive Electronics ('IDE') adapters, Small Computer System Interface ('SCSI') adapters, Serial AT Attachment ('SATA'), and others. Non-volatile computer memory also may be implemented for as an optical disc drive, electrically erasable programmable read-only memory (so-called 'EEPROM' or 'Flash' memory), RAM drives, etc.

The data storage 716 may include one or more storage devices in a tiered or non-tiered configuration. The data storage 716 may include one or more memory chip thermal profile inputs that are received by the application and stored for later use by the memory controller 714 through RAM 715.

The example computer 708 may include one or more input/output (I/O) adapters 722. I/O adapters implement user-oriented input/output through, for example, software drivers and computer hardware for controlling output to display devices such as computer display screens 724, as well as user input from user input devices 726 such as keyboards, mice, styli, or touchscreens, according to various embodiments. The example computer 708 may include a video adapter at 722, which is an example of an I/O adapter specially designed for graphic output to a display device 724 such as a display screen or computer monitor. The video adapter (I/O) would be connected to processor 710 through a bus adapter 717, and the front side bus 728, which is also a high-speed bus.

The example computer 708 includes a communications adapter 730 for data communications with other computers, for example, mobile devices, and for data communications with a data communications network. Such data communications may be carried out serially through RS-232 connections, through external buses such as a Universal Serial Bus (USB), through data communications networks such as IP data communications networks, and in other ways as will occur to those of skill in the art. Communications adapters implement the hardware level of data communications through which one computer sends data communications to another computer, directly or through a data communications network. Examples of communications adapters include modems for wired dial-up communications, Ethernet (IEEE 802.3) adapters for wired data communications network communications, and IEEE 802.77 adapters for wireless data communications network communications.

The descriptions of the various embodiments of the present disclosure have been presented for purposes of illustration, but are not intended to be exhaustive or limited to the embodiments disclosed. Many modifications and variations will be apparent to those of skill in the art without departing from the scope and spirit of the described embodiments. The terminology used herein was chosen to best explain the principles of the embodiments, the practical application or technical improvement over technologies found in the marketplace, or to enable others of skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure is not necessarily limited to such applications, various aspects of the disclosure may be appreciated through a discussion of various examples using this context.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:
1. A method, comprising:
receiving, by a memory controller, a plurality of thermal profiles from a plurality of three-dimensional (3D)-stacked memory chips, wherein the plurality of thermal profiles include thermal profile data for the memory chips, wherein the thermal profile data includes a memory chip usage data and a location data for each of the memory chips, and wherein the memory chips include a first memory chip and a second memory chip;

generating, by the memory controller, a first predicted memory chip usage data and location data of the first memory chip by analyzing the usage data and location data of the thermal profile data of the first memory chip;

generating, by the memory controller, a second predicted memory chip usage data and location data of the second memory chip by analyzing the usage data and location data of the thermal profile data of the second memory chip;

determining, by the memory controller, based on the first predicted memory chip usage and the second predicted memory chip usage, fractional memory chip read propensity data for the first memory chip and the second memory chip, wherein the fractional memory chip read propensity data includes memory chip read distribution data;

determining, by the memory controller, a first fractional memory chip read propensity distribution, based on the fractional memory chip read propensity data; and distributing, by the memory controller, according to the first fractional memory chip read propensity distribution, memory chip read operations to the first memory chip and the second memory chip.

2. The method of claim 1, wherein the thermal profile data for the first memory chip and the second memory chip includes past and present thermal profile data.

3. The method of claim 1, wherein the usage data of the first memory chip and the second memory chip includes dynamic chip profiling.

4. The method of claim 1, wherein determining the first fractional memory read propensity distribution, based on the fractional memory chip read propensity data, includes:
   determining that a change in a thermal profile of one or more memory chips meets a first threshold, and reducing switching of reads and writes by changing chip usage.

5. The method of claim 1, wherein the predicted memory chip usage data and location data of the first memory chip and the second memory chip include a predicted read burst, wherein the predicted read burst guides the distribution of reads of the first memory chip and second memory chip.

6. The method of claim 1, further comprising:
   distributing, by the memory controller, according the fractional memory chip read propensity distribution, memory chip write operations to the first memory chip and the second memory chip.

7. The method of claim 1, wherein the memory chip read distribution data includes read burst interleaving.

8. The method of claim 1, wherein the first fractional memory read propensity distribution is optimized for performance.

9. A system, comprising:
a plurality of three-dimensional (3D)-stacked memory chips, a memory controller, wherein the memory controller is configured to perform operations, including:
   receiving a plurality of thermal profiles from the plurality of 3D-stacked memory chips, wherein the plurality of thermal profiles include thermal profile data for the memory chips, wherein the thermal profile data includes a memory chip usage data and a location data for each of the memory chips, and wherein the memory chips include a first memory chip and a second memory chip;

generating a first predicted memory chip usage data and location data of the first memory chip by analyzing the usage data and location data of the thermal profile data of the first memory chip;

generating a second predicted memory chip usage data and location data of the second memory chip by analyzing the usage data and location data of the thermal profile data of the second memory chip;

determining based on the first predicted memory chip usage and the second predicted memory chip usage, fractional memory chip read propensity data for the first memory chip and the second memory chip, wherein the fractional memory chip read propensity data includes memory chip read distribution data;

determining a first fractional memory chip read propensity distribution, based on the fractional memory chip read propensity data; and distributing according to the first fractional memory chip read propensity distribution, memory chip read operations to the first memory chip and the second memory chip.

10. The system of claim 9, wherein the thermal profile data for the first memory chip and the second memory chip includes past and present thermal profile data.

11. The system of claim 9, wherein the usage data of the first memory chip and the second memory chip includes dynamic chip profiling.

12. The system of claim 9, wherein determining the first fractional memory read propensity distribution, based on the fractional memory chip read propensity data, includes:
   determining that a change in a thermal profile of one or more memory chips meets a first threshold, and reducing switching of reads and writes by changing chip usage.

13. The system of claim 9, wherein the predicted memory chip usage data and location data of the first memory chip and the second memory chip include a predicted read burst, wherein the predicted read burst guides the distribution of reads of the first memory chip and second memory chip.

14. The system of claim 9, further comprising:
   distributing, by the memory controller, according the fractional memory chip read propensity distribution, memory chip write operations to the first memory chip and the second memory chip.

15. The system of claim 9, wherein the memory chip read distribution data includes read burst interleaving.

16. The system of claim 9, wherein the first fractional memory read propensity distribution is optimized for performance.

17. A computer program product for controlling memory, wherein the computer program product comprising a computer readable storage medium having program code embodied therewith, the program code comprising computer readable program code configured to:
   receive a plurality of thermal profiles from a plurality of three-dimensional (3D)-stacked memory chips, wherein the plurality of thermal profiles include thermal profile data for the memory chips, wherein the thermal profile data includes a memory chip usage data and a location data for each of the memory chips, and wherein the memory chips include a first memory chip and a second memory chip;

generate a first predicted memory chip usage data and location data of the first memory chip by analyzing the usage data and location data of the thermal profile data of the first memory chip;

generate a second predicted memory chip usage data and location data of the second memory chip by analyzing the usage data and location data of the thermal profile data of the second memory chip;

determine based on the first predicted memory chip usage and the second predicted memory chip usage, fractional memory chip read propensity data for the first memory chip and the second memory chip, wherein the fractional memory chip read propensity data includes memory chip read distribution data;

determine a first fractional memory chip read propensity distribution, based on the fractional memory chip read propensity data; and distribute according to the first fractional memory chip read propensity distribution, memory chip read operations to the first memory chip and the second memory chip.

18. The computer program product of claim 17, wherein determine the first fractional memory read propensity distribution, based on the fractional memory chip read propensity data, includes the computer readable program code being further configured to:

determine that a change in a thermal profile of one or more memory chips meets a first threshold, and reduce switching of reads and writes by changing chip usage.

19. The computer program product of claim 17, wherein the predicted memory chip usage data and location data of the first memory chip and the second memory chip include a predicted read burst, wherein the predicted read burst guides the distribution of reads of the first memory chip and second memory chip.

20. The computer program product of claim 17, wherein the computer readable program code is further configured to:

distribute, according the fractional memory chip read propensity distribution, memory chip write operations to the first memory chip and the second memory chip.

* * * * *